United States Patent
Fujii et al.

(10) Patent No.: US 8,306,264 B2
(45) Date of Patent: Nov. 6, 2012

(54) SECTION PROCESSING METHOD AND ITS APPARATUS

(75) Inventors: Toshiaki Fujii, Chiba (JP); Junichi Tashiro, Chiba (JP); Mike Hassel-Shearer, Northridge, CA (US)

(73) Assignees: SII NanoTechnology Inc. (JP); SII NanoTechnology USA Inc.

( * ) Notice: Subject to any disclaimer, the term of this patent is extended or adjusted under 35 U.S.C. 154(b) by 761 days.

(21) Appl. No.: 12/380,432

(22) Filed: Feb. 27, 2009

(65) Prior Publication Data

US 2010/0008563 A1 Jan. 14, 2010

(30) Foreign Application Priority Data

Feb. 28, 2008 (JP) .................................. 2008-047577

(51) Int. Cl.
*G06K 9/00* (2006.01)
(52) U.S. Cl. ....................................................... 382/103
(58) Field of Classification Search .......... 250/307–310; 703/1; 702/179; 382/144–152; 257/429; 29/833–836; 438/16–19; 348/126–129
See application file for complete search history.

(56) References Cited

U.S. PATENT DOCUMENTS

2003/0183776 A1 * 10/2003 Tomimatsu et al. ..... 250/442.11

FOREIGN PATENT DOCUMENTS

| JP | 2002318178 | 10/2002 |
| JP | 2006023249 | 1/2006 |
| JP | 2006294614 | 10/2006 |

* cited by examiner

*Primary Examiner* — Atiba O Fitzpatrick
(74) *Attorney, Agent, or Firm* — Adams & Wilks

(57) ABSTRACT

A section processing apparatus has a mark forming control portion that transmits control information for forming marks on a surface of a sample. Each of the marks has at least two portions intersecting at a converging portion located at a previously determined position of an observation target section of the sample or in the vicinity of the previously determined position. A first focused ion beam apparatus emits a first focused beam for forming each of the marks on the surface of the sample based on the control information transmitted by the mark forming control portion and for processing a section of the sample. The section of the sample is processed by scanning the first focused beam in parallel with the at least two portions of the marks in the direction of the converging portion, while the section of the sample and positions of the marks are observed by a second focused ion beam apparatus, and to finish processing of the section of the sample when the first focused beam reaches the converging portion or a vicinity thereof.

7 Claims, 10 Drawing Sheets

SECTION PROCESSING METHOD AND ITS APPARATUS

BACKGROUND OF THE INVENTION

1. Field of the Invention

The present invention relates a section processing method and its apparatus. The invention relates to a section processing method and its apparatus of forming a section for observation by moving a processing position by successively carrying out removal processing for a sample, when for example, a defect of an inner portion of a semiconductor chip is observed.

2. Background Information

In a background art, when, for example, a failure at an inner portion of a semiconductor chip is observed, a section for observation is formed by rupturing a sample by a focused ion beam and observing the section by an electron microscope. With regard to the section for observation, for example, a position of a defect of a sample is specified by a defect inspection apparatus, and section processing is carried out based on the position information. That is, removal processing is successively repeated by irradiating a focused ion beam to a sample and a processing face is moved to a position at which a defect is present. A defect to be observed is extremely small, and therefore, at a vicinity of a position at which the defect is present, also an amount of moving the processing face is made to be small, for example, the section processing needs to be progressed while observing the processing face by a scanning electron microscope (SEM) or the like.

Further, the same goes with also a case of forming a TEM sample for observing by a transmission electron microscope (TEM).

In order to accurately and efficiently carry out the section processing, it is known to apply a mark to the sample and progress section processing while detecting a position of the mark.

As such a section processing method and its apparatus, for example, Patent Reference 1 describes a sample evaluation/processing observation system of forming two marks in a cross shape indicating an observation line constituting a center line of a TEM sample on an outer side of a region of processing the TEM sample prior to forming the TEM sample by a focused ion beam apparatus, detecting positions of the marks, and carrying out positioning or the section processing of the processing object. According to the system, the mark is formed on a non-processing face substantially orthogonal to an observation face of the TEM sample by the focused ion beam.

Further, Patent Reference 2 describes a technology in a method and apparatus of fabricating a sample of processing a sample by irradiating an ion beam to a processing face of the sample and forming a mark at a periphery of a sample processing portion for forming the mark to find out in which direction the sample processing portion is disposed in view from the mark. According to the sample fabricating method described in Patent Reference 2, in a case of fabricating a TEM sample, in a sample block constituting a processing object, marks respectively having shapes different from each other are formed in a processing face irradiated with an ion beam and a surface in a direction of observing the TEM sample, and a direction of the sample processing portion relative to the face formed with the mark is known.

[Patent Reference 1] JP-A-10-64473
[Patent Reference 2] JP-A-2005-114578

However, according to the above-described section processing method and its apparatus of the background art, the following problem is posed.

According to the technology described in Patent Reference 1, the mark is formed on the observation line on the outer side of the processing region of the TEM sample, that is, on the non-processing face substantially orthogonal to the observation face of the TEM sample, and therefore, observation of the processing face and detection of the mark position cannot simultaneously be carried out. Further, also when the mark is detected by using the focused ion beam, the mark is remote from the processing region, and therefore, it is necessary to scan a position different from the processing position or realign a focal point to respective positions, and therefore, a step separate from section processing is constituted.

Therefore, after subjecting one processing face to section processing, observation of the processing face and detection of the mark need to be carried out separately from each other, and therefore, a problem that a processing time period is increased is posed.

According to the technology described in Patent Reference 2, the mark is formed also in the direction of observing the TEM sample other than the mark provided at the processing face similar to Patent Reference 1, and therefore, although after subjecting the processing face to section processing, the mark can be observed from a direction the same as that of observing the processing face, the mark only indicates the direction of the sample processing portion, and therefore, distance information of the processing face relative to the mark provided at the processing face cannot be acquired. Therefore, with regard to whether the processing face is progressed up to a target position, the mark on the side of the processing face needs to be observed, and therefore, a problem similar to that of Patent Reference 1 is invariably posed.

The invention has been carried out in view of the above-described problem and it is an object thereof to provide a section processing method and its apparatus capable of promoting a processing efficiency of section processing.

SUMMARY OF THE INVENTION

In order to resolve the above-described problem, a section processing method of the invention is a section processing method of forming a section for observation by moving a processing position by subjecting a sample successively to removal processing in order to observe a section of the sample in a previously determined observation target section or an observation region including the observation target section, the section processing method including a mark portion forming step of forming a mark portion capable of being processed by the removal processing and capable of identifying a mark shape in the section for observation within a range of capable of forming the section for observation at a vicinity of the observation target section, a section forming step of forming the section for observation by subjecting the sample and the mark portion to the removal processing within a range of including the mark portion formed by the mark portion forming step, and an observation image acquiring step of acquiring an observation image of the section for observation in the midst of being formed or after having been formed by the section forming step.

According to the invention, first, at the mark portion forming step, there is formed the mark portion capable of being processed by the removal processing and capable of identifying the mark shape in the section for observation within the range of capable of forming the section for observation at the vicinity of the previously determined observation target section. Next, at the section forming step, the section for observation is formed by subjecting the sample and the mark portion to the removal processing within the range of including the mark portion formed by the mark portion forming step. Further, at the observation image forming step, the observation image of the section for observation in the midst of forming or after having been formed by the section forming step.

The mark shape of the mark portion is identifiably appears at the observation image of the section for observation, and therefore, by only observing the section for observation, it can be detected that the processing position of the section reaches the position provided with the mark portion. Therefore, it is not necessary to scan the mark portion with a beam disposed at a remote location other than for observing the section, or the beam is refocused on respective positions. Further, by providing the mark portion at a position remote from a plane including the observation target section by a constant distance or distance range, it can be detected that the position at the constant distance or distance range from the observation target section is reached. Thereby, a processing position at a successive section forming step can pertinently be set.

Further, according to the section processing method of the invention, it is preferable that at the mark portion forming step, the mark portion is formed by a shape of changing at least either one of the mark shape and a position of the mark shape in the section for observation in accordance with the processing position of the section for observation formed by the section forming step.

In this case, according to the mark portion, at least either one of the mark shape and the position of the mark shape in the section for observation is changed in accordance with the processing position of the section for observation formed by the section forming step, and therefore, by changing at least either one of the mark shape of the mark portion and the position acquired by the observation acquiring step, the section processing can be carried out while confirming the change in the processing position.

Further, according to the section processing method of the invention and the section processing method of forming the mark portion in the shape by which at least either one of the mark shape and the position of the mark shape in the section for observation is changed in accordance with the processing position of the section for observation formed by the section forming step, it is preferable that the section processing method of the invention further includes a processing position information acquiring step of acquiring information of the processing position of the section for observation in correspondence with the observation image from at least either one of the mark shape of the mark portion and the position of the mark shape in the section for observation by acquiring at least either one of the mark shape of the mark portion and the position of the mark shape in the section for observation from the observation image acquired by the observation image acquiring step.

In this case, by the processing position information acquiring step, the information of the processing position of the section for observation in correspondence with the observation image can be acquired.

Further, according to the section processing method including the processing position information acquiring step of the invention, it is preferable that the section processing method including the processing position information acquiring step of the invention further includes a section processing control step of determining whether a successive section for observation is formed in accordance with the information of the processing position of the section for observation acquired by the processing position information acquiring step, and when the successive section for observation is formed, setting an amount of the removal processing in a successive section forming step based on the information of the processing position of the section for observation.

In this case, it is determined whether the successive section for observation is formed by the section processing control step, and when the successive section for observation is formed, based on the information of the processing position of the section for observation, the amount of the removal processing in the successive section forming step is set, and therefore, a method preferable for automatic processing is constituted.

A section processing apparatus of the invention is a section processing apparatus of forming a section for observation by moving the processing position by subjecting a sample successively to removal processing for observing a section of the sample in a previously determined observation target section, or an observation region including the observation target section, the section processing apparatus including a mark portion forming control portion of forming control information for forming a mark portion capable of being processed by the removal processing and capable of identifying a mark shape in the section for observation at a position capable of forming the section for observation at a vicinity of the observation target section or the observation region including the observation target section, a section forming control portion of forming the section for observation by subjecting the mark portion to the removal processing within a range of including the mark portion formed based on the control information of the mark portion forming control portion, and an observation image acquiring control portion of acquiring an observation image of the section for observation formed by the section forming control portion.

According to the invention, a section processing apparatus capable of being used in the section processing method of the invention is provided, and therefore, operation and effects similar to those of the section processing method of the invention are achieved.

Further, it is preferable that the section processing apparatus of the invention further includes a processing position information acquiring portion of acquiring at least either one of the mark shape of the mark portion and a position of the mark shape in the section for observation from the observation image acquired by the observation image acquiring control portion, and acquiring information of the processing position of the section for observation in correspondence with the observation image from at least either one of the mark shape of the mark portion and the position of the mark shape in the section for observation.

In this case, a section processing apparatus capable of using the section processing method including the processing position information acquiring step of the invention is provided, and therefore, operations and effects similar to those of the section processing method including the processing position information acquiring step of the invention are achieved.

Further, it is preferable that the section processing apparatus of the invention further includes a section processing control unit of determining whether a successive section for observation is formed in accordance with the information of the processing position of the section for observation acquired by the processing position calculating portion, and when the successive section for observation is formed, setting an amount of the removal processing in the successive section forming step based on the information of the processing position of the section for observation.

In this case, the section processing apparatus capable of being used in the section processing method including the processing position information acquiring step of the invention is constituted, and therefore, operation and effect similar to those of the section processing method including the processing position information acquiring step of the invention are provided.

A section processing apparatus of the invention is constructed by a constitution of a section processing apparatus including a first focused beam apparatus of processing a sample by a first focused beam, and a second focus beam apparatus of observing a process position of the first focused beam apparatus by a second focused beam, the section processing apparatus including a mark forming control portion of forming control information for forming mark portions having converging portions of converging at least either one of a mark shape and a position of the mark shape as proceeding a section processing at least two portions on a surface of the sample such that the converging portions come to previously determined positions of an observation target section or vicinities of the positions, wherein the at least two portions of mark portions are formed by etching or deposition based on the control information by using the first focused beam apparatus, thereafter, section processing is carried out while being proximate to the observation target section from a position of being remote from the observation target section by mainly scanning the first focused beam in a direction in parallel with a direction of connecting the respective converging portions of the mark portions, the process section of the mark portion is observed by the second focused beam apparatus, and the section processing is finished when the converging portion or a vicinity thereof is reached.

According to the invention, the section processing apparatus capable of being used in the section processing method of the invention is constituted, and therefore, operation and effect similar to those of the section processing method of the invention are provided.

According to the section processing method and apparatus of the invention, the processing position can be detected by only acquiring the observation image of the section for observation, and therefore, processing efficiency of the section processing is achieved.

DETAILED DESCRIPTION OF THE PREFERRED EMBODIMENTS

An embodiment of the invention will be explained in reference to the attached drawings as follows.

First, a section processing apparatus according to an embodiment of the invention will be explained.

Figure 1:
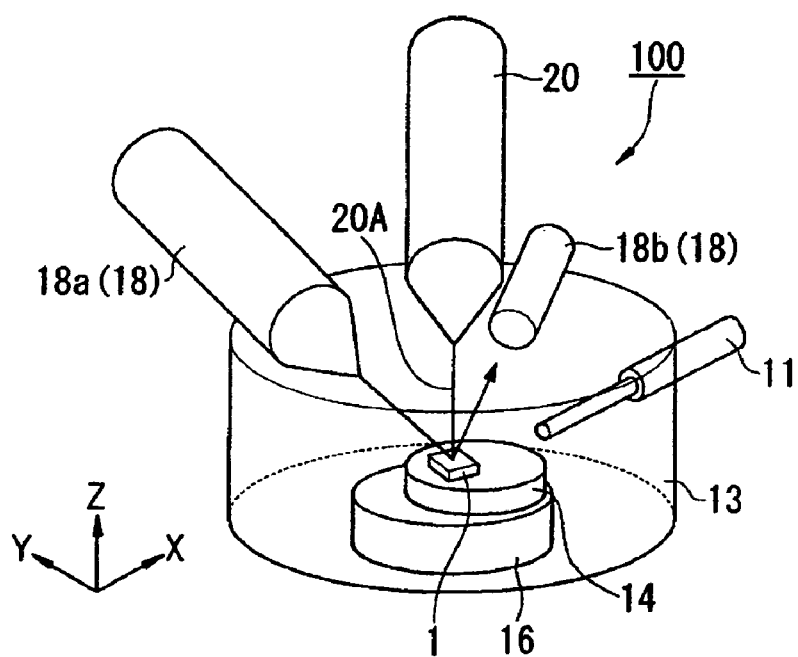
FIG. 1 is a schematic perspective view showing an outline constitution of a section processing apparatus according to an embodiment of the invention.
Figure 2:
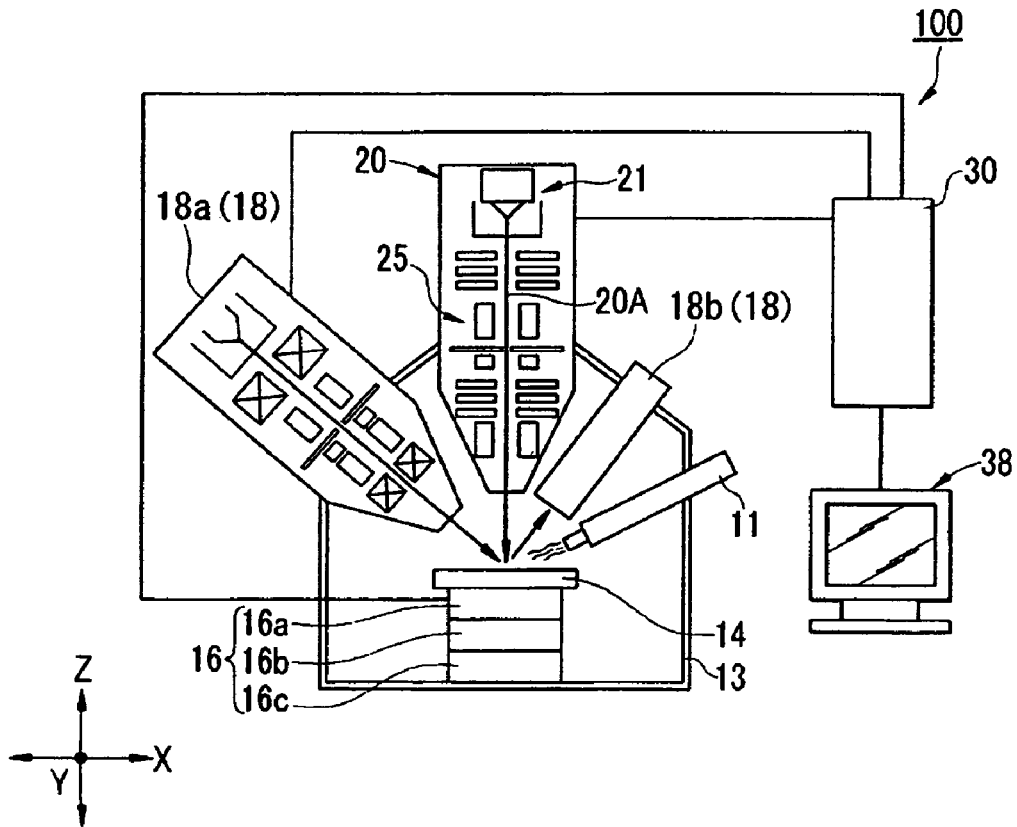
FIG. 2 is a schematic sectional view showing the outline constitution of the section processing apparatus according to the embodiment of the invention.
Figure 3:
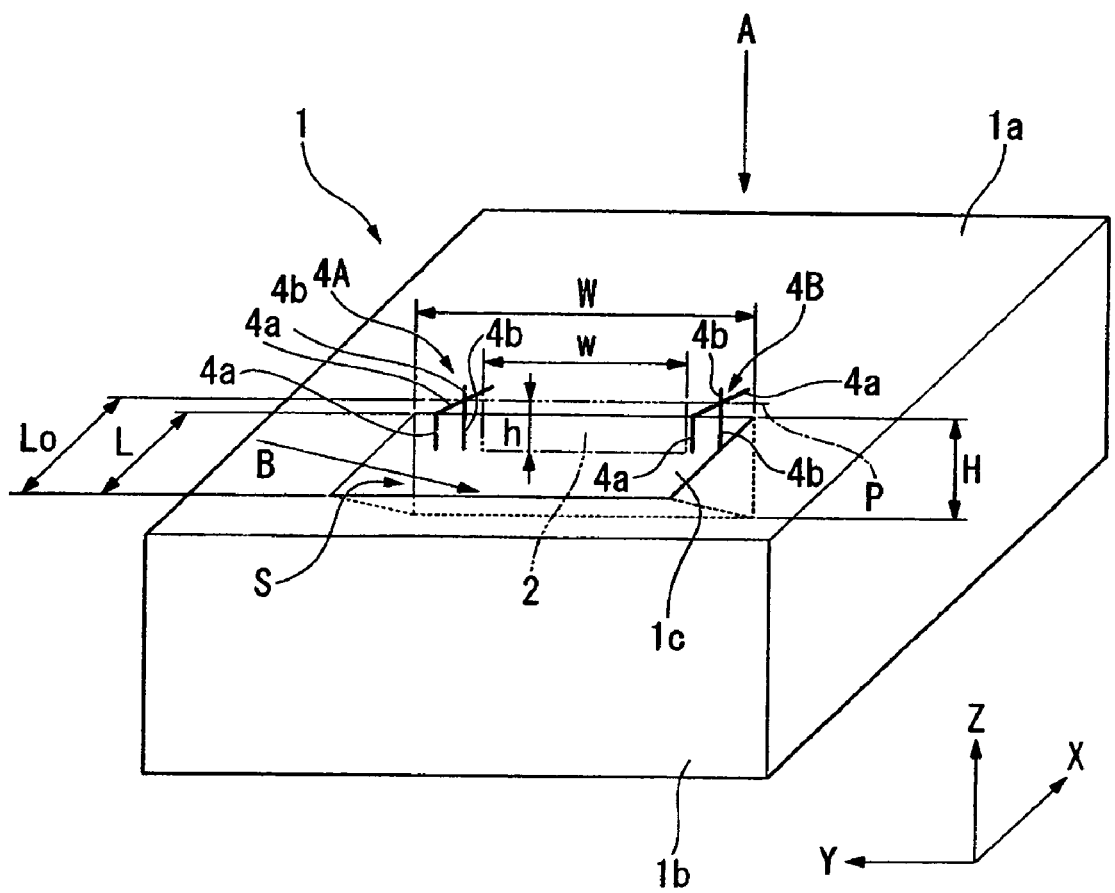
FIG. 3 is a schematic perspective view showing a behavior of a sample in the midst of processing by the section processing apparatus according to the embodiment of the invention.
Figure 4:
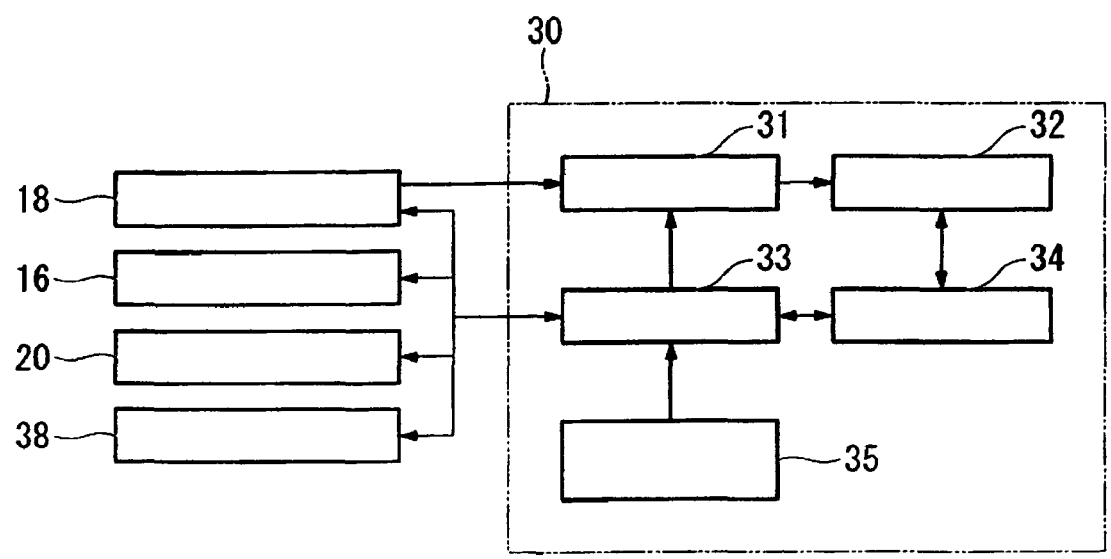
FIG. 4 is a functional block diagram of a control unit of the section processing apparatus according to the embodiment of the invention.

FIG. 1 is a schematic perspective view showing an outline constitution of a section processing apparatus according to an embodiment of the invention. FIG. 2 is a schematic sectional view showing the outline constitution of the section processing apparatus according to the embodiment of the invention. FIG. 3 is a schematic perspective view showing a behavior of a sample in being processed by the section processing apparatus according to the embodiment of the invention. FIG. 4 is functional block diagram of a control unit of the section processing apparatus according to the embodiment of the invention. Further, an XYZ coordinates system described in the drawings are provided commonly to the respective drawings for convenience of reference of directions, a Z axis positive direction indicates an upper side in a vertical direction and an XY plane indicates a horizontal face, respectively.

As shown by FIGS. 1, 2, a section processing apparatus 100 of the embodiment includes a vacuum chamber 13, an ion beam irradiating system 20, a sample base 14 holding a sample 1, a sample stage 16 movably holding the sample base 14, a scanning electron microscope (hereinafter, abbreviated as SEM) 18, a gas gun 11, a control unit 30 (section processing control unit), and a display portion 38.

The vacuum chamber 13 is made to be able to reduce a pressure until a predetermined vacuum degree, and a portion or a total of respective constituent portions excluding the control unit 30 and the display portion 38 are arranged at inside of the vacuum chamber 13.

The section processing apparatus 100 forms a section for observation by moving a processing position by successively carrying out removable processing of the sample 1 in order to observe a section of the sample 1 in a previously determined observation target section, or an observation region including the observation target section by a constitution thereof.

FIG. 3 shows an example of a state of the sample 1 during processing thereof.

The sample 1 is for observing a section at a previously determined observation target section 2, or an observation region including the observation target section 2 and is constituted by, for example, a semiconductor chip or the like having a defect.

In an example of FIG. 3, the sample 1 is constituted by a plate-like member having a processing face 1a arranged to be orthogonal to an arrow mark A coinciding with an optical axis of the ion beam irradiating system 20.

Further, a processing face 1c opposed to an observing direction is made to be able to be formed by subjecting the sample 1 to removal processing by irradiating an ion beam 20A (first focused beam) from the ion beam irradiating system 20 while moving the sample 1 by the sample stage 16. A vicinity of the processing face 1c is formed with an inclined face inclined from the process face 1a to a lower end (Z axis negative direction side in the illustration) of the processing face 1c. Further, a total of the processing face 1c is made to be able to be observed from the observing direction (arrow mark B direction) along the inclined face by SEM 18. That is, the processing face 1c constitutes a section for observation.

A position and a size of the observation target section 2 are previously determined based on position information of the defect of the sample 1 acquired by, for example, a defect inspection apparatus (not illustrated) or the like. Further, in the defect inspection apparatus, when an error of a position of detecting the defect is conceivable or when observation of a plurality of sections is needed since the defect is large, or also when an image of a normal portion at a surrounding of the defect is intended to observe, a three-dimensional observation region including the observation target section is set, and inside of the observation region can successively be observed.

An explanation will be given as follows such that a reference position is constituted by a constant position on the sample 1, for example, a position formed with an intersection of the processing face 1a and the inclined face, which is a region in a rectangular shape of a width w×a height h within a section at a distance L0. That is, the observation target section 2 is disposed at the distance L0 in the observing direction. An intersection of the observation target section 2 and the processing face 1a is referred to as an observation target line P.

Mark portions 4A, 4B directly or indirectly indicate a position of the observation target section 2, and are formed at the sample 1 prior to the section processing by the section processing apparatus 100.

Respective constitutions of the section processing apparatus 100 will be explained as follows.

The ion beam irradiating system 20 includes a focused ion beam barrel an optical axis of which is arranged in a vertical direction, and which is arranged above the sample base 14 at inside of the vacuum chamber 13. Therefore, the sample 1 is made to be able to be etched to a vertical lower side (Z axis negative direction of the illustration) by irradiating the ion beam 20A from a vertical upper side (Z axis positive direction of the illustration) to the sample 1 mounted above the sample base 14.

Further, the ion beam irradiating system 20 is electrically connected to the control unit 30, and a position of irradiating or a condition of irradiating the ion beam 20A is controlled by a control signal of the control unit 30.

The ion beam irradiating system 20, and the control unit 30 constitute a first focused beam apparatus.

The ion beam irradiating system 20 includes a gas field ion source 21 of generating an ion to flow out, and an ion optical system 25 of forming the ion extracted from the gas field ion source 21 into the ion beam 20A constituting the focused ion beam at inside of the focused ion beam barrel.

The gas field ion source 21 is provided with a constitution of, for example, a gas generating chamber maintained in a high vacuum state, an emitter a front end of which is constituted by a shape of a pyramid sharpened by an atomic level and which is constituted by covering noble metal of platinum, paradium, iridium, rhodium, gold or the like to a needle-like base member comprising tungsten or molybdenum, a gas supply source of supplying a small amount of a rare gas (for example, Ar gas) to the ion chamber, an extracting electrode, and a cooling apparatus or the like, although not particularly illustrated.

By such a constitution, the gas field ion source 21 generates a rare gas ion by applying a voltage between the emitter and the extracting electrode (field ion formation) and the ion beam by the rare gas ion is made to be able to be emitted to the ion optical system 25.

The ion optical system 25 is constituted by arranging, for example, a condenser lens of focusing the ion beam from the gas field ion source 21 from a side of the gas field ion source 21 to a side of the vacuum chamber 13, a diaphragm of narrowing the ion beam, an aligner for adjusting an optical axis of the ion beam, an object lens of focusing the ion beam to the sample, and a deflector of scanning the ion beam above the sample in this order.

According to the ion beam irradiating system 20 having such a constitution, a source size is made to be able to be equal to or smaller than 1 nm, also energy spread of the ion beam is made to be able to be equal to or smaller than 1 eV, and therefore, a beam diameter of the focused ion beam can be narrowed to, for example, 1 nm or smaller. Further, the focused ion beam using the gas field ion source 21 is also made to be able to be used for observing the processing face 1c in place of SEM 18.

As shown by FIG. 2, the sample stage 16 is constituted by a tilting mechanism 16a for moving to tilt around X axis, Y axis, an XYZ moving mechanism 16b of carrying out parallel movements along X axis, Y axis, Z axis, and a rotation mechanism 16c of carrying out rotational movement around Z axis, and the sample base 14 is held above the tilting mechanism 16a.

Further, the tilting mechanism 16a, the XYZ moving mechanism 16b, and the rotation mechanism 16c are respectively connected to be able to communicate with the control unit 30, and moving amounts thereof are controlled by the control signal from the control unit 30.

SEM 18 (second focused beam apparatus) is for acquiring an observation image of a processing face (section for observation) formed by the ion beam 20A in the sample 1 on the sample base 14. According to the embodiment, SEM 18 has a well-known construction including an electron gun, a focusing lens, a scanning coil, an object lens or the like and is constituted by an SEM main body 18a of scanning an electron probe (second focused ion beam) above the sample 1, and a secondary electron detector 18b of detecting a secondary electron emitted from above the sample 1.

According to the embodiment, a section for observation is formed in parallel with an YZ plane of FIGS. 1, 2, and therefore, an optical axis of the SEM main body 18a is arranged along the observing direction.

Although the secondary electron detector 18b is arranged to a skewed upper side of the sample 1 in FIGS. 1, 2, an arranging position thereof is not particularly limited so far as the secondary electron emitted from the sample 1 can be detected.

Further, SEM 18 is electrically connected to the control unit 30, and an operation of acquiring an observation image is controlled by the control signal of the control unit 30.

A detection output of the secondary electron detector 18b is transmitted to the control unit 30 in a state of being able to synchronize with a scanning position of the electron probe. Further, SEM 18 may be provided with CRT for displaying the detection output of the secondary electron detector 18b in analog.

The gas gun 11 supplies gases of a gas for increasing an etching rate for increasing an etching rate of etching by the ion beam 20A, a gas for deposition when a mark portion mentioned later is formed by deposition to a vicinity of the sample 1.

When the ion beam 20A is irradiated to the sample 1 by supplying the gas for deposition from the gas gun 11, gas assist deposition can be carried out and a deposited object or a film-formed object of a metal or an insulator can be formed on the sample 1.

The control unit 30 is for generally controlling the section processing apparatus 100, and is electrically connected with respective portions constituting the section processing apparatus 100, for example, the ion beam irradiating system 20, the sample stage 16, SEM 18 and the like.

Further, the control unit 30 is connected with the display portion 38 constituted by a monitor for displaying an image of a section for observation of the sample 1 based on image data transmitted from the secondary electron detector 18b, or overlapping, for example, a character or a sign of position information of the processing face or the like on the image to display.

As shown by FIG. 4, the control unit 30 is functionally constituted by an image taking portion 31, a storing portion 32, an operation processing portion 34 (processing position information acquiring portion), an apparatus control portion 33, and a mark portion forming control portion 35.

The image taking portion 31 takes in the detection output of the secondary electron detector 18b as brightness data for respective scanning positions of the electron probe, generates two-dimensional image data and transmits the data to the storing portion 32.

The storing portion 32 stores the image data of the section for observation of the sample 1 taken by the image taking portion 31 and stores information necessary for operation of the operation processing portion 34, a result of operation and the like.

The operation processing portion 34 detects a mark shape of the mark portion mentioned later appeared in the section by subjecting image data stored to the storing portion 32 to an image processing, calculates at least either one of the mark shape of the mark portion and a position of the mark shape at inside of the section, and calculates a processing position of the section at which the image data is acquired from information of a shape of the mark portion and a position of forming the mark portion previously stored to the storing portion 32.

The apparatus control portion 33 controls operational timings of the image taking portion 31 and the operation processing portion 34 and controls to operate respective portions of the apparatus connected to the control unit 30.

The mark portion control forming portion 35 transmits control information for forming the mark portion capable of identifying the mark shape within the section for observation by the ion beam irradiating system 20 to the apparatus control portion 33.

Although an exclusive hardware may be used for the apparatus constitution of the control unit 30, according to the embodiment, the constitution is realized by executing programs for operation and for control by a computer having CPU, a memory, an external memory, an input/output interface and the like.

In this way, the section processing apparatus 100 of the embodiment is constituted by a compound focused beam apparatus including the first focused beam apparatus of processing the sample by the first focused beam, and the second focused beam apparatus of observing the processing position of the first focused beam apparatus by the second focused beam.

Next, an operation of the section processing apparatus 100 will be explained.

Figure 5:
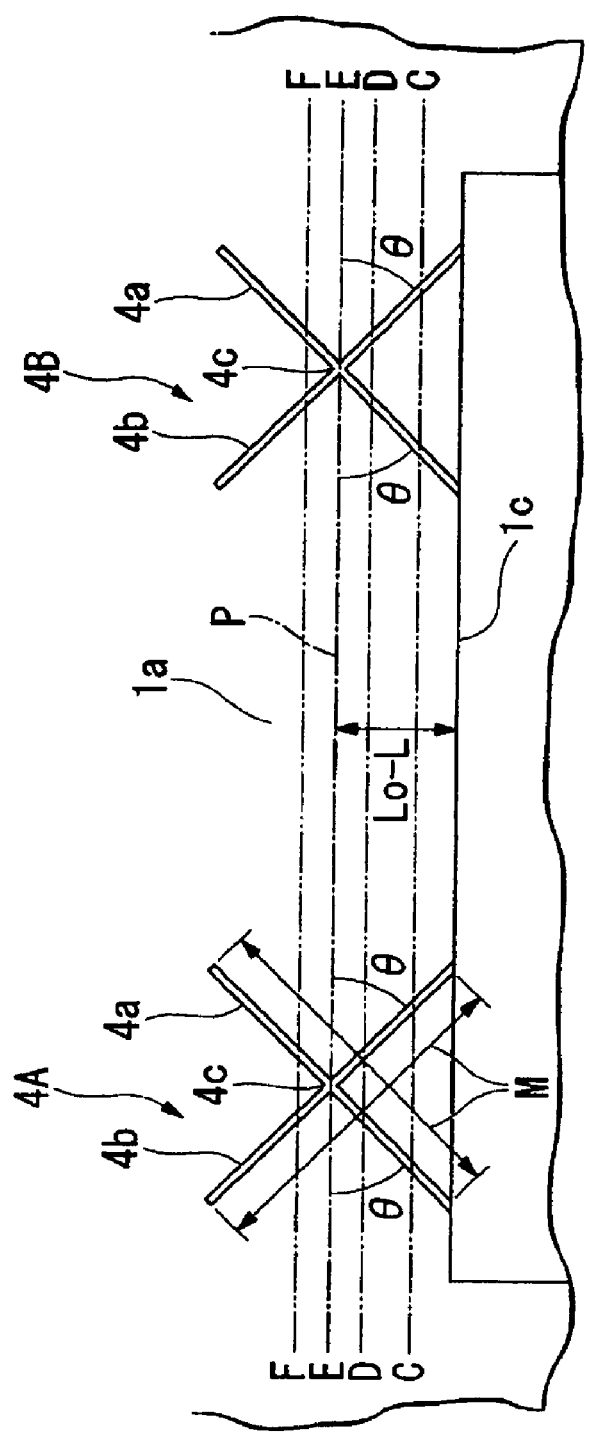
FIG. 5 is a partially enlarged view in view from A direction of FIG. 3.
Figure 6A:
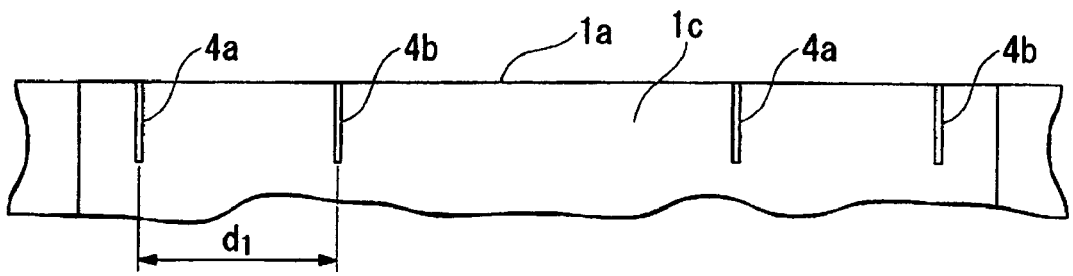
FIG. 6 illustrates partial enlarged views viewed in B direction of FIG. 3 when a processing face reaches sections respectively along C-C line, D-D line, E-E line, F-F line of FIG. 5.
Figure 6B:
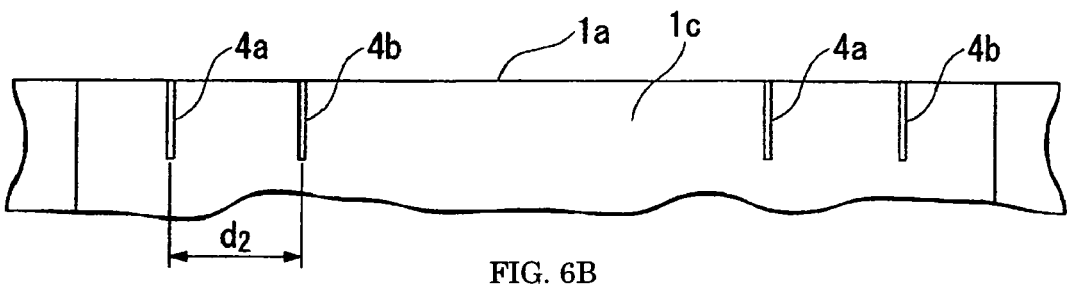
Figure 6C:
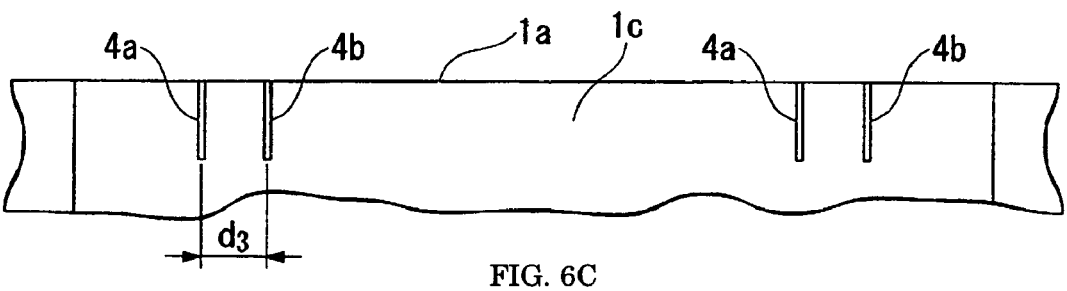
Figure 7A:
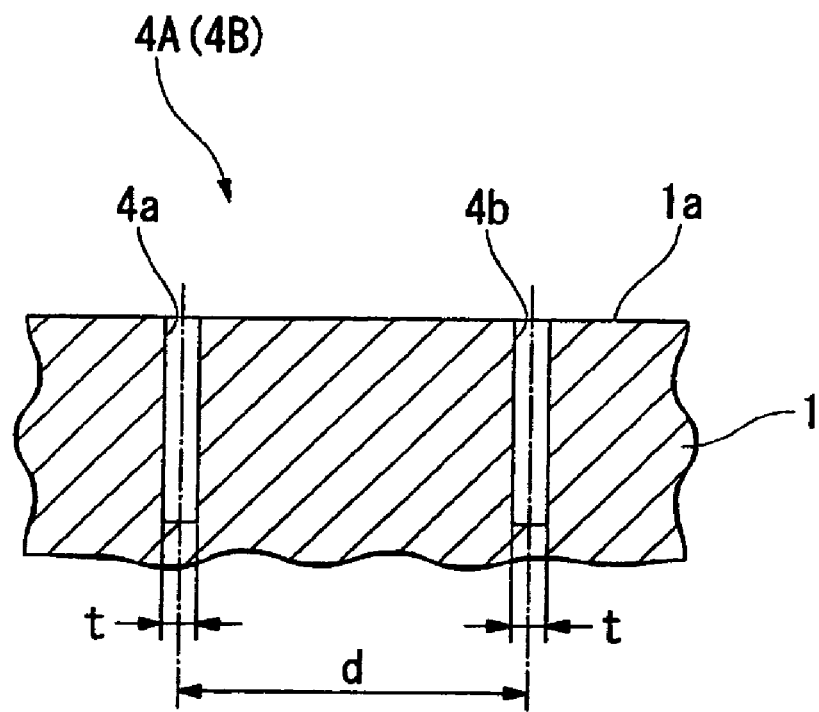
FIG. 7 illustrates schematic partial sectional views of an example of a mark shape of a mark portion according to the embodiment of the invention and a mark shape of a first modified example.

FIG. 5 is a view enlarging a portion viewed by the arrow mark A direction of FIG. 3. FIGS. 6(a), (b), (c), (d), (e) are views enlarging a portion of FIG. 3 viewed in B direction when the processing face reaches respective sections of FIG. 5 along C-C line, D-D line, E-E line, F-F line. FIG. 7(a) is a schematic partial sectional view showing an example of a mark shape of the mark portion according to the embodiment of the invention.

A section processing method of the embodiment using the section processing apparatus 100 carries out a mark portion forming step, a section forming step, an observation image acquiring step, a processing position information acquiring step, and a section processing control step in this order.

However, depending on a determination of the section processing control step, steps from the section forming step to the section processing control step are repeatedly carried out. Further, the section forming step and the observation image acquiring step may be executed in parallel with each other.

At the mark portion forming step, the mark portion capable of being processed by the removable processing by the ion beam 20A capable of identifying the mark shape and within the section for observation is formed in a range capable of forming the section for observation at a vicinity of the observation target section 2 by transmitting control information for forming the mark portion from the mark portion forming control portion 35 to the apparatus control portion 33. According to the embodiment, a cross mark in a shape of a check mark is provided in a progressing direction of forming the section in view from an upper face of the sample.

For example, in an example shown in FIGS. 3, 5, 6(a), the mark portions 4A, 4B are formed at a vicinity on an outer side in a width direction of the observation target section 2 by transmitting control information for respectively processing grooves 4a, 4b of a length M provided by a constant depth to an inner side of the sample 1 from the processing face 1a in a shape of being intersected in X-like shape at respective middle points on the processing face 1a from the mark portion forming control portion 35 to the apparatus control portion 33.

Positions of the mark portions 4A, 4B in the observing direction are provided such that centers of intersected portions 4c (converged portions, refer to FIG. 5) respectively intersected with the grooves 4a, 4b are disposed on an observation target line P. Further, the respective grooves 4a, 4b are inclined to the observation target line P by an angle θ. Here, an angle θ is an angle constituting an acute angle in angles made by the grooves 4a, 4b relative to the observation target line P.

Further, ranges of forming the mark portions 4A, 4B in X axis direction are set to be equal to or larger than at least a width in X axis direction of the observing region.

The grooves 4a, 4b can be identified by SEM 18 since when processed at the processing face 1c, as shown by FIG. 7(a), an edge in a channel-like shape or a U-like shape having a width t and a distance d between centers appears along the groove on the processing face 1c.

The mark portions 4A, 4B constitute mark portions having converging positions of converging at least either of the mark shape and the position of the mark shape as progressing section processing at least two portions on the surface of the sample.

The marks portions 4A, 4B are formed as follows.

First, for example, position information of the observation target section 2 acquired during an inspection by a defect inspection apparatus or the like is informed to the apparatus control portion 33 of the control unit 30 as coordinates information on the sample 1 by pertinent means. For example, the position information may be informed to the apparatus control portion 33 by manually inputting the position information from an operating portion, not illustrated, or may automatically be informed to the apparatus control portion 33 by way of a communication network when the section processing apparatus 100 and the defect inspection apparatus are connected the communication network.

Next, the apparatus control portion 33 positions SEM 18 and the sample 1 held by the sample base 14 within YZ plane by driving the sample stage 16 such that a position of an observable range of SEM 18 (scannable range of electron probe) constituting a rectangular shape region of a width W×a height H (where, W>w, H>h) includes a total of the observation target section 2, and the observation target section 2 is disposed substantially at a center portion in a width direction of the observable range from position information and information of a size of the observation target section 2.

On the other hand, the mark portion forming control portion 35 calculates coordinates of forming the intersected portion 4c on the observation target line P from the position information of the observation target section 2 acquired by the apparatus control portion 33, generates information of controlling the ion beam irradiation system 20 such that the ion beam 20A emitted from the ion beam irradiating system 20 draw loci of the respective grooves 4a, 4b of the mark portions 4A, 4B on the sample 1 and transmits the information to the apparatus control portion 33.

Depths and groove widths of the grooves 4a, 4b are not particularly limited so far as the mark shape can excellently be observed SEM 18 when processed at the section forming step. That is, the depths and groove widths may be constituted by sizes capable of accurately resolving an edge position, a groove width or the like of the mark shape of the processing face 1c and recognizing the edge position or the groove width by being differentiated from an image of other portion at inside of the sample 1. However, in order to shorten the processing time period, it is preferable that both of the depths and the widths are as small as possible.

The apparatus control portion 33 irradiates the ion beam 20A to the processing face 1a by controlling the ion beam irradiating system 20 based on information transmitted from the mark portion forming control portion 35. Thereby, the grooves 4a, 4b of the mark portion 4A are formed by etching the sample 1 with the ion beam 20A.

Next, the mark portion 4B is similarly formed. The mark portion forming step is finished by the above-described.

Next, the section forming step is carried out. (A in FIG. 3 is an ion beam direction)

The section forming step is a step of forming the processing face 1c by carrying out removal processing to the sample 1 and the mark portions 4A, 4B by the ion beam 20A within the range of width W×height H including the mark portions 4A, 4B.

According to the example of the embodiment, the mark portions 4A, 4B are formed at positions of a distance L from a reference position of determining a position of the observation target section 2, and therefore, at an initial section forming step, removable processing is carried out until end portions of the mark portions 4A, 4B are processed at the processing face 1c. That is, as shown by FIG. 3, the step carries out processing of forming a space S constituted by a skewedly inclined recess portion from the processing face 1a to the observation target section 2, and forming the processing face 1c of width W×height H of the position of L from the reference position in X axis positive direction.

First, an optical axis of the ion beam irradiating system 20 is moved onto the reference position of the processing face 1a. Further, the sample 1 is moved to a side in X axis negative direction up to the position of the distance L while reciprocally moving the sample 1 in Y axis direction within a range of the width W by irradiating the ion beam 20A.

Thereby, the ion beam 20A is subjected to raster scanning on the processing face 1a, a region in correspondence with the space S is processed to remove to provide a state shown in FIG. 3.

In such a section forming step, the ion beam irradiating system 20 and the control unit 30 constitute a section forming control portion.

The removable processing may be carried out without observing the processing face 1c in the midst of processing by SEM 18 when end portions in X axis direction of the mark portions 4A, 4B are sufficiently remote from the observation target line P in comparison with a processing accuracy.

Further, in the removable processing, when there is not a concern of implanting an impurity constituting a hindrance in observing the observation target section 2, in order to promote the etching rate, gas assist etching may be carried out by supplying a gas for increasing the etching rate from the gas gun 11.

Next, the observing image acquiring step is carried out. (B in FIG. 3 is an Electron Probe Direction)

The observing image acquiring step is a step of acquiring the observation image of the processing face 1c formed by the section forming step.

That is, the electron probe generated by the SEM main body 18a is subjected to raster scanning on the processing face 1c, and secondary electrons emitted from the processing face 1c at respective scanning positions are detected by the secondary electron detector 18b.

The secondary electron detector 18b transmits the detection output of the secondary electron to the image taking portion 31 of the control unit 30 along with a synchronizing signal synchronized with a scanning position of the electron probe.

The image taking portion 31 takes in the detection output from the secondary electron detector 18b transmitted based on the synchronizing signal as brightness data for the respective scanning positions of the electron probe, generates the two-dimensional image data and transmits the data to the storing portion 32. The two-dimensional image data stored to the storing portion 32 is transmitted as an image signal to the display portion 38 by the apparatus control portion 33 and is displayed on the display portion 38.

Next, a processing position information acquiring step is carried out.

The processing position information acquiring step is a step of acquiring information of the processing position of the processing face 1c in correspondence with the two-dimensional image from at least either of the mark shape and the position of the mark shape by acquiring at least either one of the mark shape and the position of the mark shape of the mark portion 4A, 4B at inside of the processing face 1c.

According to the embodiment, information of the processing position is acquired by subjecting the two-dimensional image data to an image processing by the operation processing portion 34. For example, the groove shape in the channel-like shape or the U-like shape constituting the mark shape is extracted by an image processing of edge extraction or the like and a position in Y axis direction of a groove inner face, a width of a groove, a position of a center of a groove and the like are calculated.

However, depending on accuracy of necessary information of the processing position, the processing position may generally be grasped from the image of the display portion 38 by observing the image displayed on the display portion 38 by a processing person.

The position information of the processing face 1c is uniquely calculated from a distance between centers of the mark shapes of the grooves 4a, 4b processed at the processing face 1c. For example, in a case of rupturing the mark portions 4A, 4B at end portions of the grooves 4a, 4b as shown by FIG. 6(a), when the distance between centers of the mark shape is designated by notation d1, a distance to the observation target line P (L0–L) is known as shown by the following equation.

$$L0-L=(d1 \cdot \tan \theta)/2$$

The relationship is previously stored to the storing portion 32.

When the position in the observing direction of the processing face 1c is changed as in C-C line, D-D line, F-F line shown in FIG. 5, the distance between centers is changed to d2, d3, d4 in accordance therewith. When ratios thereof to d1 are calculated, distances to the observation target line P at the respective positions can be calculated from a relationship of similarity ratios. For example, when the distance between centers becomes d2, a distance x to the observation target line P becomes x=(L0–L)·(d2/d1).

Figure 6D:
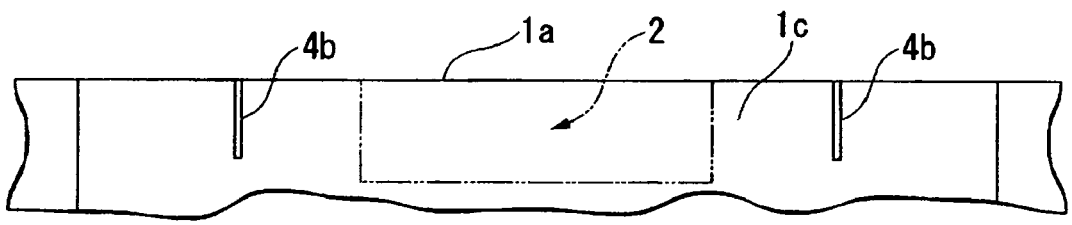
Figure 6E:
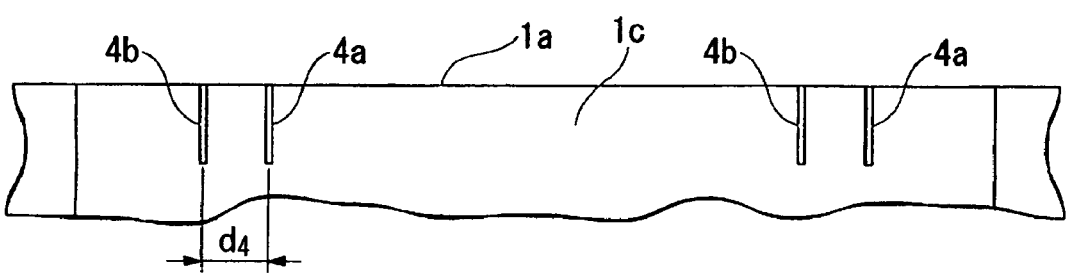

When the processing face 1c is proximate to the observation target line P, the grooves 4a, 4b are combined and the mark shape becomes one groove. When the processing face 1c and the observation target line P coincide with each other, as shown by FIG. 6(d), the intersected portion 4c is broken, and a previously known shape of a groove of a minimum width appears in accordance with widths of the grooves 4a, 4b and the angle θ.

Therefore, according to the step, the distance from the processing face 1c to the observation target line P can be calculated by calculating the distances between centers when the shape of processing face the two grooves appears at the position of the mark portion 4A (4B), and when the shape of processing one groove appears at the position of the mark portion 4A (4B), by calculating the groove width. That is, the embodiment constitutes an example in a case of acquiring information of the position of the processing face 1c by acquiring the mark shape of the mark portion and the position of the mark shape in the processing position information acquiring step.

Further, according to the embodiment, the mark portions 4A, 4B are formed by the same shape, and therefore, when the position information of the processing face 1c acquired from the mark portion 4A and the position information of the processing face 1c acquired from the mark portion 4B differ from each other, it can be detected that the processing face 1c is formed not to be in parallel with the observation target line P, and an angle of intersection thereof to the observation target line P can be calculated.

Next, the section processing control step is carried out.

The step determines whether a successive section for observation is to be formed in accordance with the position information of the processing face 1c acquired by the processing position information acquiring step, and sets a removal processing amount in the successive section forming step based on current position information of the processing face 1c when the successive section for observation is formed.

According to the embodiment, the observation region at the vicinity of the observation target section 2 is previously set, and a plurality of sections including the observation target section 2 are observed. Therefore, the apparatus control portion 33 carries out a control of finishing section processing when the outermost side in X axis positive direction of the observation region is reached, or brought into outside of a range of the observation region from the position of the processing face 1c acquired by the processing position information acquiring step.

Otherwise, the apparatus control portion 33 calculates the removal processing amount within a range not exceeding the observation target line P from the distance to the observation target line P by the operation processing portion 34. Further, the section forming step is carried out similar to the above-described by changing a beam diameter or the like of the ion beam 20A as necessary in accordance with the removal processing amount, further, carries out a control of repeating the observation image acquiring step, the processing position information acquiring step, and the section processing control step. Thereby, the section processing for the sample 1 can be carried out by automatic processing.

The removal processing amount is stored to the storing portion 32 in the form of an operation equation or a data table to constitute a pertinent amount in accordance with a number of sections observed until the observation target line P and after exceeding the observation target line P. Further, setting of the removal processing amount includes also setting of subjecting a trapezoidal region to removal processing on XY plane by correcting a direction of scanning the ion beam 20A when the processing face 1c is inclined to the observation target line P.

However, in determining whether section processing is stopped or continued, or setting the removal processing amount, the removal processing amount may be set manually by a determination by a working person based on information of the processing position of the processing face 1c acquired by the processing position information acquiring step.

In this way, according to the section processing apparatus 100, the section of the sample 1 at the observation region in the vicinity of the observation target section 2, including the observation target section 2, can be observed.

At that occasion, the observation image acquired by the observation image acquiring step includes the mark shapes of the mark portions 4A, 4B, and therefore, the position information of the observed processing face 1c can be acquired from the mark shape and the position of the mark shape by the processing position information acquiring step, and the section observation within the observation region including the observation target section 2 can firmly be carried out by the section processing control step. That is, a step of acquiring the image of the processing face 1a or the like may not be provided as in the background art in order to acquire the position information of the processing face 1c, and therefore, a processing efficiency of section processing can be promoted in comparison with the background art.

Further, SEM 18 is used as the section observation image acquiring control portion, and therefore, when the section observation image acquiring step is carried out in parallel with the section forming step, the processing efficiency can further be promoted.

Next, modified examples of mark portions used in the section processing method of the embodiment will be explained. All of the mark portions can be used in place of the mark portions 4A, 4B of the embodiment.

Figure 7B:
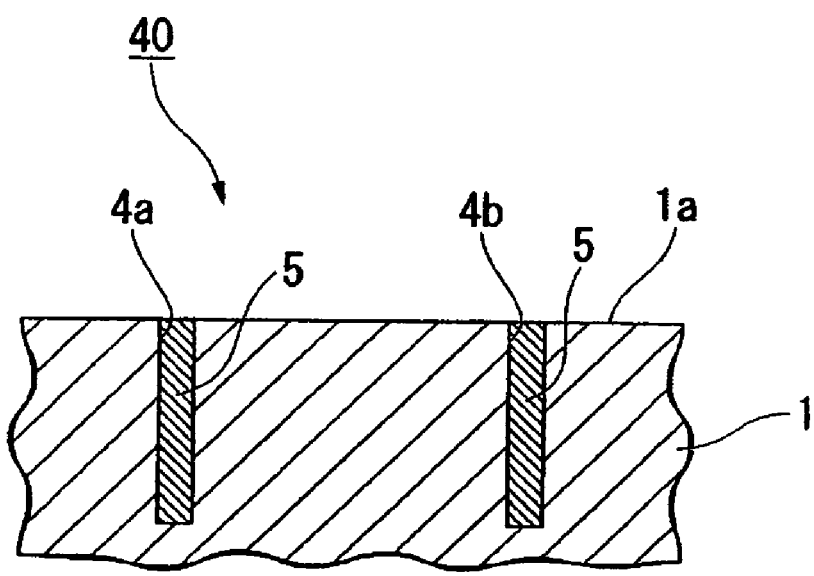
Figure 8A:
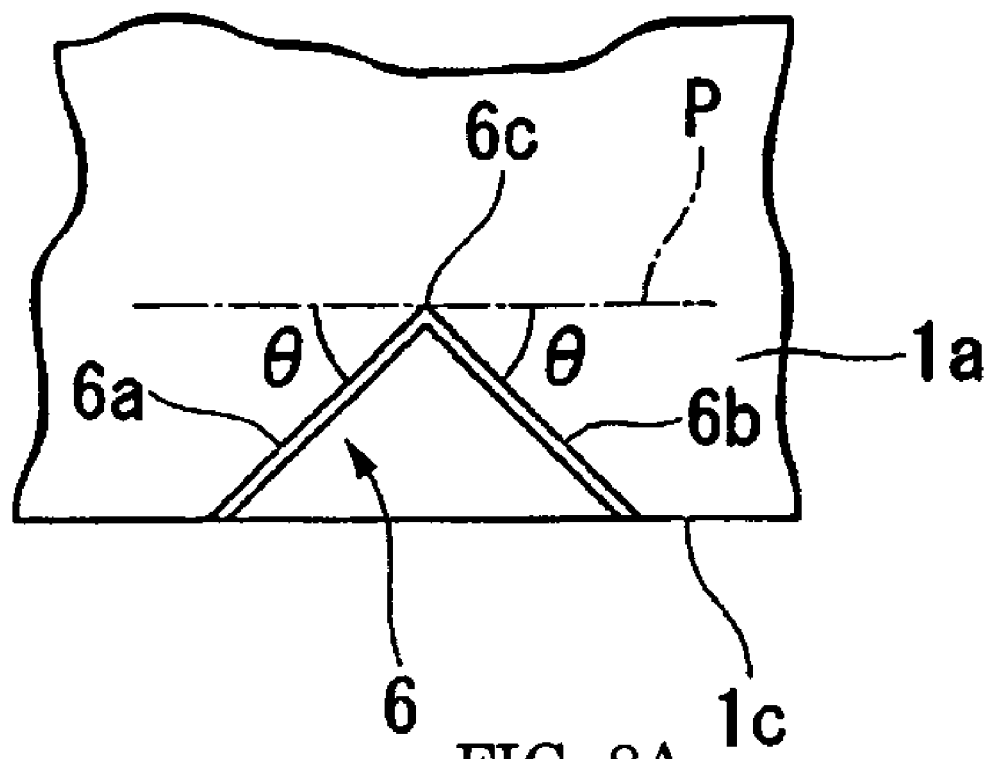
FIG. 8 illustrates a schematic plane view (viewed in irradiating direction) and a schematic front view (viewed in observing direction) of a second modified example of a mark portion used in a section processing method according to the embodiment of the invention.
Figure 8B:
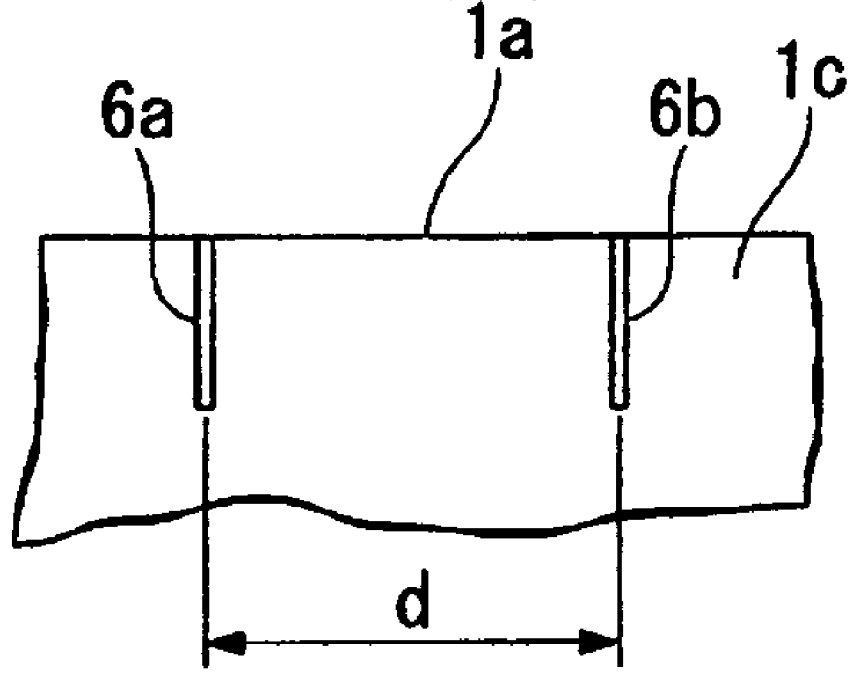
Figure 9A:
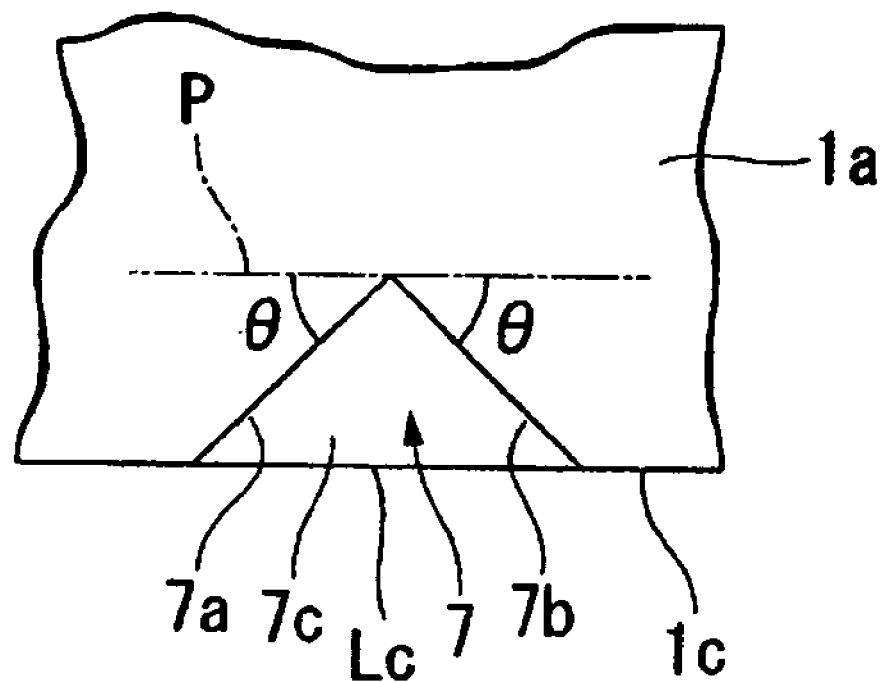
FIG. 9 illustrates a schematic plane view and a schematic front view of a third modified example of a mark portion used in the section processing method according to the embodiment of the invention.
Figure 9B:
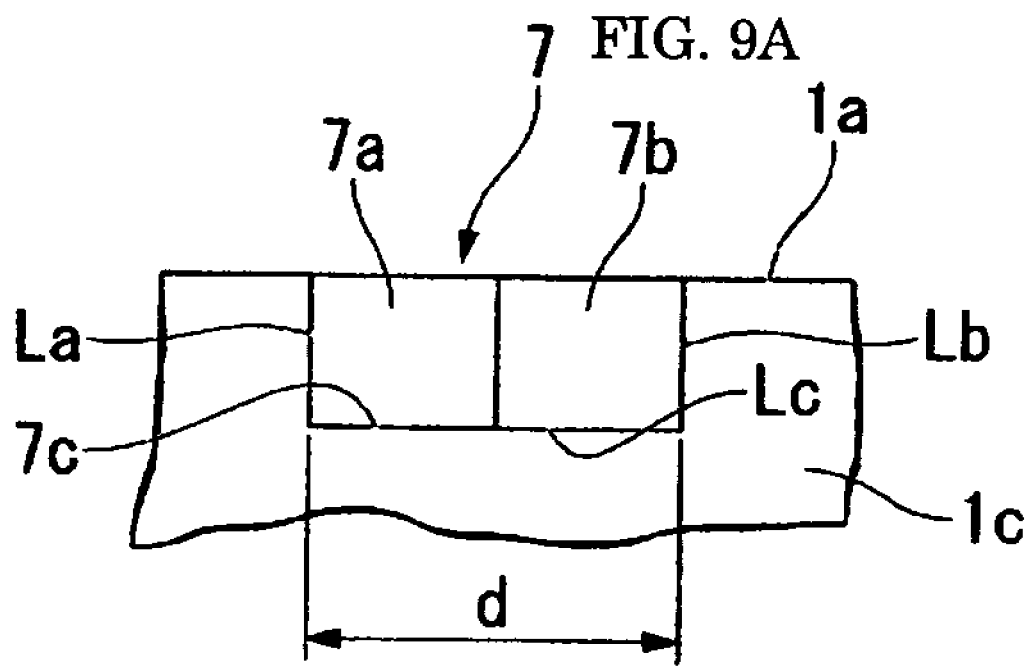
Figure 10A:
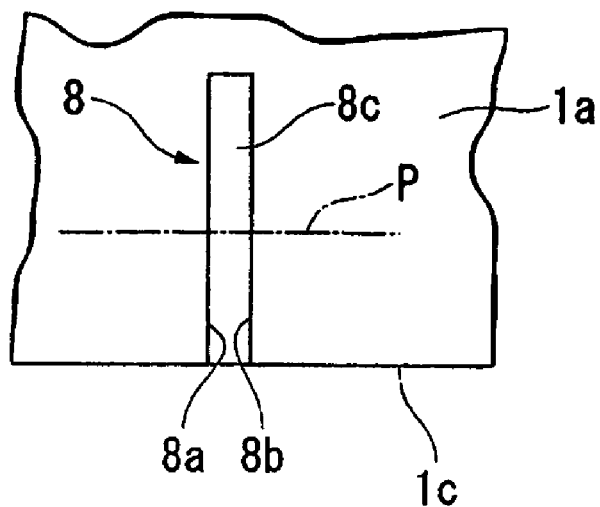
FIG. 10 illustrates a schematic plane view and a schematic front view of a fourth modified example of a mark portion used in the section processing method according to the embodiment of the invention.
Figure 10B:
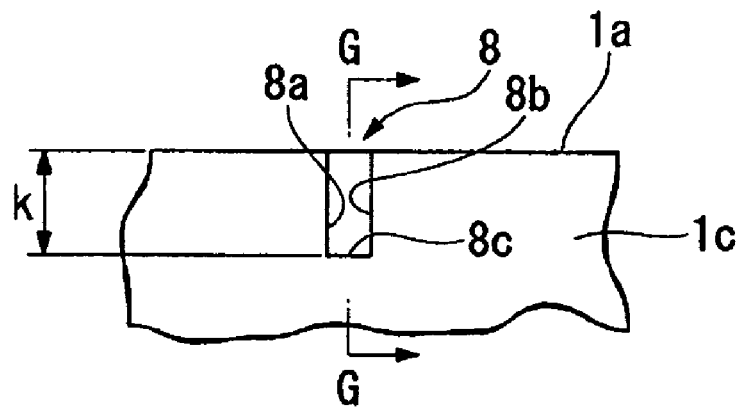
Figure 10C:
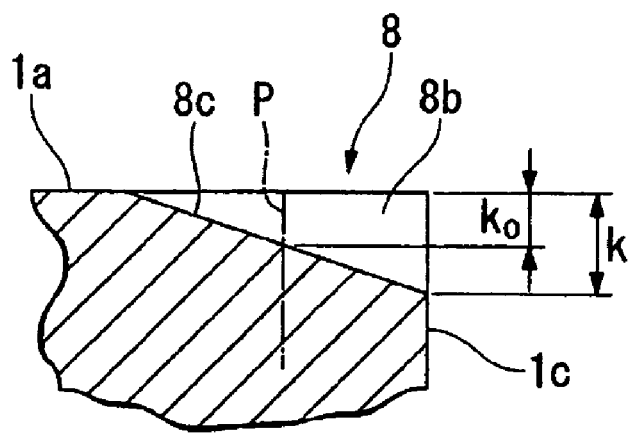
Figure 11A:
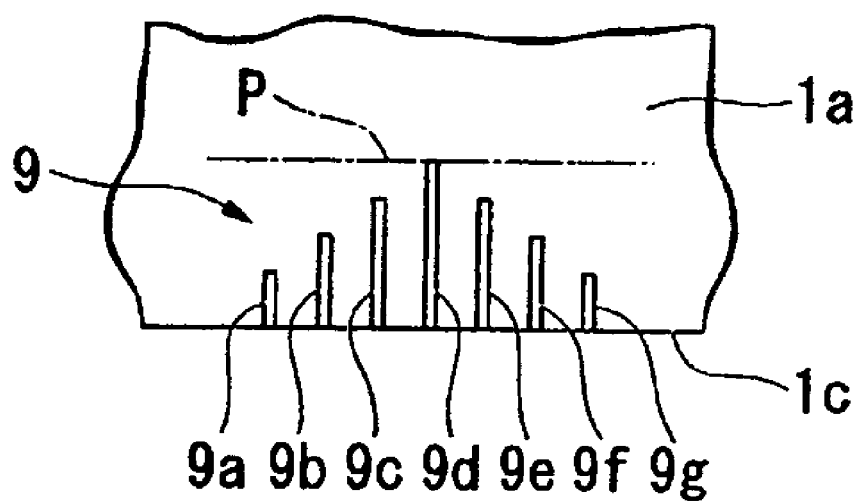
FIG. 11 illustrates a schematic plane view and a schematic front view of the fourth modified example of a mark portion used in the section processing method according to the embodiment of the invention.
Figure 11B:
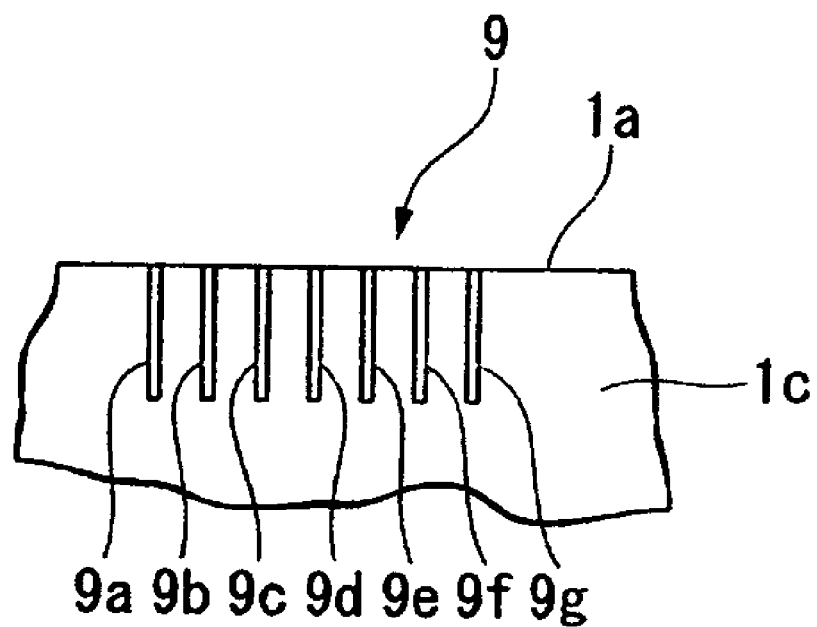

FIG. 7(b) is a schematic partial sectional view showing a mark shape of a first modified example of a mark portion used in the section processing method according to the embodiment of the invention. FIGS. 8(*a*), (*b*) are a schematic plane view (viewed in irradiating direction) and a schematic front view (viewed in observing direction) of a second modified example of a mark portion used in the section processing method according to the embodiment of the invention. FIGS. 9(*a*), (*b*) are a schematic plane view and front view of a third modified example of a mark portion used in the section processing method according to the embodiment of the invention. FIGS. 10(*a*), (*b*) are schematic plane view and a front view of a fourth modified example of a mark portion used in the section processing method according to the embodiment of the invention. FIG. 10(*c*) is a sectional view taken along a line G-G of FIG. 10(*b*). FIGS. 11(*a*), (*b*) are a schematic plane view and a front view of a fourth modified example of a mark portion used in the section processing method according to the embodiment of the invention.

As shown by FIG. 7(*b*), a mark portion 40 of the first modified example is constituted by forming the mark portion 4A (4B), thereafter, forming a deposition portion 5 by which the grooves 4*a*, 4*b*, the intersected portion 4*c* are embedded by a pertinent material.

A material of the deposition portion 5 is not particularly limited so far as a mark shape can be identified by the observation image acquiring control portion.

The deposition can be carried out by irradiating the ion beam 24 by supplying a gas for deposition from the gas gun 11.

According to the mark portion 6 of the second modified example, as shown by FIG. 8(*a*), grooves 6*a*, 6*b* intersected with the observation target line P by the angle θ are provided by a shape of a ridge converged to a side of the observation target line P in the observing direction, and a top portion 6*c* (converging portion) in the ridge shape is formed on the observation target line P.

The mark portion 6 of the modified example is preferable when an observation region is constituted by a region until reaching the observation target section 2.

According to the modified example, the processing position information acquiring step can be carried out quite similar to the embodiment.

As shown by FIGS. 9(*a*), (*b*), a mark portion 7 of the third modified example, is constituted by a groove in a shape of a triangular pillar including inner side faces 7*a*, 7*b* respectively intersected with the observation target line P by the angle θ and being converged to the side of the observation target line P. An intersection of the inner side faces 7*a*, 7*b* constitute a converging portion.

According to the mark portion 7 of the modified example, edges La, Lc, Lb constituting a channel-like shape are formed on the processing face 1*c* as shown by FIG. 9(*b*) by being processed by the section forming step, which can be identified by SEM 18. Further, the position of the processing face 1*c* can be calculated similar to the above-described embodiment by using a distance d between the edges La, Lb in place of the distance d between centers of the grooves 4*a*, 4*b* of the above-described embodiment.

Further, the modified example is preferable when the observing region is constituted by the region until reaching the observation target section 2 similar to the above-described second modified example.

According to the modified example, the processing position information acquiring step can be carried out quite similar to the above-described embodiment.

As shown by FIGS. 10(*a*), (*b*), (*c*), a mark portion 8 of the fourth modified example is constituted by a groove which is intersected with the observation target line P and a depth of which is changed in accordance with a distance from the observation target line P. For example, there can be adopted a groove in a shape or a triangular slit which is interposed by inner side faces 8*a*, 8*b*, and is provided with an inclined bottom face 8*c* a depth of which becomes small as proceeding in an observing direction by a depth k at the processing face 1*c* and in which the depth becomes k0 at a position intersected with the observation target line P.

According to the mark portion 8 of the modified example, a position of an edge of the inclined bottom face 8*c* constituting a mark shape appeared at the processing face 1*c* is changed by being processed by the section forming step, and therefore, position information of the processing face 1*c* can be calculated.

According to the embodiment, the position of the processing face 1*c* is not related to positions or shapes of the inner side faces 8*a*, 8*b*, and therefore, only the position of the edge by the inclined bottom face 8*c* may be acquired from the two-dimensional image data. Therefore, the image processing at the operation processing portion 34 is simplified.

Further, the modified example becomes the example when information of the processing position of the section for observation is acquired by acquiring only the position of the mark shape of the mark portion in the processing position acquiring step. Further, the modified example constitutes an example of the mark portion which does not include the converging portion.

Further, although the modified example is explained by an example when the inclined bottom face 8*c* is constituted by an inclined plane constituting an oblique side of the triangular slit, when the position of the processing face 1*c* relative to the observation target line P can be calculated from the depth of the inclined bottom face 8*c*, the inclined bottom face 8*c* may be constituted by a curved face.

As shown by FIGS. 11(*a*), (*b*), a mark portion 9 of the fifth modified example is constituted by grooves 9*a*, 9*b*, 9*c*, 9*d*, 9*e*, 9*f*, 9*g* having lengths different from each other and provided by changing the lengths such that a number of pieces of mark shapes is changed by a processing position between the processing face 1*c* to the observation target line P. The example is constructed by a constitution in which the groove 9*d* reaches the observation target line P, and groove lengths of all of the other grooves in the observing direction are shorter than that of the groove 9*d*.

According to the mark portion 9 of the modified example, the number of pieces of the mark shapes appeared at the processing face 1*c* by being processed by the section forming step is changed from 7 piece to 0 piece, and the smaller the number of pieces, the more the proximity to the observation target line P can be detected. Therefore, the position information of the processing face 1*c* can be acquired as information of a range of position at which the processing face 1*c* is present.

According to the modified example, only the number of pieces of the grooves is made to be able to be counted, and therefore, it is not necessary to accurately calculate the position of the mark shape. Therefore, the modified example constitutes an example when information of the processing position of the section for observation is acquired by acquiring only the mark shape of the mark portion.

Although an explanation has been given of examples of the various mark portions, the invention is not limited to the mark portions but any shape of a mark portion in which at least either one of the mark shape and a position of the mark shape is converged to a target section as proceeding the section processing can be adopted. Further, a mark portion which is not provided with a converging portion will do so far as proximity to the observation target line P can be detected.

Further, although in the above-described explanation, an explanation has been given by an example when the intersected portion 4c of the mark portions 4A, 4B, the top portion 6c of the mark portion 6, and the intersected position of the inner side faces 7a, 7b of the mark portion 7 are respectively arranged on the observation target line P, the arranging positions may be set to a constant position on a front side in the observing direction of the observation target line P.

Further, although in the above-described explanation, an explanation has been given by an example when the processing face 1c is formed and the section is observed by SEM 16, the section of the observation target section 2 may be observed by TEM by rupturing the section until the vicinity of the observation target section 2, thereafter, processing the section to the observation target line P from a direction inverse to the observing direction, forming a thin plate including the observation target section 2 and cutting out the thin plate from the sample 1.

That is, the section processing method of the embodiment constitutes a section processing method preferable also when a TEM sample is formed.

Further, although in the above-described explanation, an explanation has been given by an example when the processing position information acquiring step and the section processing control step are carried out after the observation image acquiring step, in a case in which only the position at the vicinity of the observation target section may be observed to a degree of rupturing the mark portion, when it is found out that the mark portion is processed in the observation image acquiring step, the section forming step may not be continued further, and therefore, the processing position acquiring step and the section processing control step may be omitted.

Further, all of constituent elements described in the embodiment and the modified example explained in the above-described can be replaced or combined to executed within the range of the technical thought of the invention when technically possible.

What is claimed is:

1. A section processing apparatus comprising:
a mark forming control portion that transmits control information for forming marks on a surface of a sample, each of the marks having at least two portions intersecting at a converging portion located at a previously determined position of an observation target section of the sample or in the vicinity of the previously determined position;
a first focused ion beam apparatus that emits a first focused beam for forming each of the marks on the surface of the sample based on the control information transmitted by the mark forming control portion and for processing a section of the sample; and
a second focused ion beam apparatus that emits a second focused beam for observing the section of the sample processed by the first focused beam of the first focused ion beam apparatus;
wherein the first focused ion beam apparatus is configured to process the section of the sample by scanning the first focused beam in parallel with the at least two portions of the marks in the direction of the converging portion, while the section of the sample being processed and positions of the marks are observed by the second focused ion beam apparatus, and to finish processing of the section of the sample when the first focused beam reaches the converging portion or a vicinity thereof.

2. A section processing apparatus according to claim 1; further comprising an observation image acquiring control portion for acquiring an observation image of the section of the sample being processed that is observed by the second focused ion beam apparatus.

3. A section processing apparatus according to claim 2; further comprising a processing position information acquiring portion for acquiring information of a processing position of the section of the sample in accordance with the observation image acquired by the observation image acquiring control portion.

4. A section processing apparatus according to claim 1; wherein the at least two portions of each mark comprises at least two grooves formed by the first focused beam emitted by the first focused ion beam apparatus.

5. A section processing apparatus according to claim 1; wherein the converging portion formed by the at least two portions of each of the marks lies on an observation target line of the observation target section of the sample.

6. A section processing apparatus according to claim 1; wherein each of the marks is in the shape of a triangular pillar and the at least two portions of each mark comprise inner side faces of the triangular pillar intersecting at the converging portion.

7. A section processing apparatus according to claim 6; wherein the converging portion formed by the intersecting inner side surfaces of each triangular pillar lies on an observation target line of the observation target section of the sample.

* * * * *